(12) United States Patent
Iucolano et al.

(10) Patent No.: US 12,165,871 B2
(45) Date of Patent: Dec. 10, 2024

(54) METHOD FOR MANUFACTURING A GATE TERMINAL OF A HEMT DEVICE, AND HEMT DEVICE

(71) Applicant: STMicroelectronics S.r.l., Agrate Brianza (IT)

(72) Inventors: Ferdinando Iucolano, Gravina di Catania (IT); Cristina Tringali, Augusta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 305 days.

(21) Appl. No.: 17/083,181

(22) Filed: Oct. 28, 2020

(65) Prior Publication Data

US 2021/0125834 A1 Apr. 29, 2021

(30) Foreign Application Priority Data

Oct. 29, 2019 (IT) .................. 102019000019980

(51) Int. Cl.
*H01L 29/778* (2006.01)
*H01L 21/285* (2006.01)
(Continued)

(52) U.S. Cl.
CPC .. *H01L 21/28581* (2013.01); *H01L 21/32135* (2013.01); *H01L 21/32139* (2013.01); *H01L 29/2003* (2013.01); *H01L 29/205* (2013.01); *H01L 29/475* (2013.01); *H01L 29/66462* (2013.01); *H01L 29/7786* (2013.01)

(58) Field of Classification Search
CPC ......... H01L 21/28581; H01L 29/66431; H01L 29/66462; H01L 29/778–7789; H01L 29/47–475; H01L 29/66143; H01L 29/812–8128; H01L 29/872–8725
See application file for complete search history.

(56) References Cited

U.S. PATENT DOCUMENTS 6,204,102 B1 3/2001 Yoon et al.
8,933,446 B2 * 1/2015 Jeon .................. H01L 29/7787
257/43
(Continued)

FOREIGN PATENT DOCUMENTS

EP 2 793 265 A1 10/2014
WO 2020/118185 A1 6/2020

OTHER PUBLICATIONS

"Ohmic contact to AlGaN/GaN HEMT with electrodes in contact with heterostructure interface" in Solid-State Electronics, vol. 151, Jan. 2019, pp. 60-64, by Dingbo Chen, Lijun Wan, Jie Li, Zhikun Liu, Guoqiang Li, (Year: 2019).*

*Primary Examiner* — Eric A. Ward
(74) *Attorney, Agent, or Firm* — Seed IP Law Group LLP (57) ABSTRACT

A method for manufacturing a HEMT device includes forming, on a heterostructure, a dielectric layer, forming a through opening through the dielectric layer, and forming a gate electrode in the through opening. Forming the gate electrode includes forming a sacrificial structure, depositing by evaporation a first gate metal layer layer, carrying out a lift-off of the sacrificial structure, depositing a second gate metal layer by sputtering, and depositing a third gate metal layer. The second gate metal layer layer forms a barrier against the diffusion of metal atoms towards the heterostructure.

18 Claims, 4 Drawing Sheets

(51) Int. Cl.
  *H01L 21/3213* (2006.01)
  *H01L 29/20* (2006.01)
  *H01L 29/205* (2006.01)
  *H01L 29/47* (2006.01)
  *H01L 29/66* (2006.01)

(56) References Cited

U.S. PATENT DOCUMENTS

| | | |
|---|---|---|
| 2006/0157735 A1 | 7/2006 | Kanamura et al. |
| 2008/0128753 A1* | 6/2008 | Parikh ............... H01L 29/66462 257/E29.253 |
| 2008/0230786 A1* | 9/2008 | Heikman .............. H01L 29/402 257/E29.253 |
| 2009/0146182 A1* | 6/2009 | Hikita ................. H01L 29/2003 257/190 |
| 2010/0207137 A1* | 8/2010 | Sazawa ............... H01L 29/0891 257/E33.013 |
| 2012/0217507 A1* | 8/2012 | Ohki .................... H01L 29/205 257/E29.246 |
| 2015/0123169 A1 | 5/2015 | Tiku et al. |
| 2015/0325698 A1* | 11/2015 | Theodorus Marinus Donkers ..... H01L 29/41725 438/572 |
| 2018/0102416 A1* | 4/2018 | Constant ............... H01L 23/291 |

* cited by examiner

METHOD FOR MANUFACTURING A GATE TERMINAL OF A HEMT DEVICE, AND HEMT DEVICE

BACKGROUND

Technical Field

The present disclosure relates to a method for manufacturing a high electron mobility transistor, HEMT, device, and the HEMT device.

Description of the Related Art

High electron mobility transistors, HEMT, based on the formation of high-mobility two-dimensional electron gas (2 DEG) layers at a heterojunction, that is at the interface between semiconductor materials with different band gaps, are known. For example, HEMT transistors based on the heterojunction between an aluminium gallium nitride (AlGaN) layer and a gallium nitride (GaN) layer are known.

The HEMT transistors based on heterojunctions or AlGaN/GaN heterostructures offer several advantages that make them particularly suitable and widely used for different applications. For example, the high breakdown threshold of HEMT transistors is exploited for high performance power switches; the high mobility of the electrons in the conductive channel allows to form high frequency amplifiers; further, the high concentration of electrons in the 2 DEG allows a low resistance to be achieved in an on-state ("ON-state resistance," $R_{ON}$).

Furthermore, GaN-based devices for radio frequency (RF) applications typically have better RF performance than similar silicon LDMOS devices.

One of the critical aspects of GaN-based HEMT devices, particularly in RF applications, concerns the gate current. This is the main cause of current leakage detectable at the drain electrode when the device is in an off-state. High values of leakage current considerably reduce the device radiofrequency (RF) performance.

BRIEF SUMMARY

The Applicant has analyzed different causes of leakage current in HEMT devices, substantially identifying three possible paths: (a) through the heterostructure surface, due to superficial traps introduced during the surface passivation or cleaning steps of the heterostructure; (b) between the gate electrode and the source electrode, due to a lateral enlargement of the gate and source electrodes that approach each other; and (c) through the Schottky barrier, due to a reduction in the barrier potential.

The Applicant has found that the aforementioned possible causes (a) and (b) play an irrelevant role in the generation of the gate leakage current, while the cause (c) is the main cause.

One approach to obviate the reduction of the barrier potential foresees the use of Nickel (Ni) as a contact metal between the gate electrode and the AlGaN barrier layer of the heterostructure. Nickel is used for its high work function. However, Nickel has a relatively high electrical resistance which does not make it suitable to entirely form the gate electrode. To this end, a layer of Gold (Au) is used to cover the Nickel and reduce its electrical resistance. However, this approach makes the manufacturing process unusable in CMOS production lines, due to the contamination of the machinery used in CMOS process lines caused by Gold. A possible Nickel substitute, to form the gate electrode, is Aluminium (Al) which, given its good electrical conductivity, may be utilized without a Gold coverage; however, the Aluminium work function is low and the choice is not optimal as this solution does not allow the gate leakage current to be effectively reduced. Furthermore, the Aluminium diffuses in the heterostructure, causing the formation of a conductive path that favors the leakage current in the off-state.

In various embodiments, the present disclosure provides a method for manufacturing a HEMT device and a HEMT device thereof adapted to overcome the drawbacks of the prior art.

According to the present disclosure, a method for manufacturing the HEMT device and a HEMT device are provided.

In one or more embodiments, a method for manufacturing a HEMT device is provided that includes: forming, on a heterostructure of a semiconductor body, a dielectric layer; forming a through opening extending through the dielectric layer to a superficial region of the heterostructure; and forming a gate electrode in the through opening. The forming the gate electrode includes: forming a sacrificial structure on the dielectric layer, the sacrificial layer extending laterally on the dielectric layer to the through opening; depositing in the through opening and onto the sacrificial structure, by an evaporation process, a first gate metal layer configured to form a Schottky contact with the heterostructure; removing the sacrificial structure and a portion of the first gate metal layer on the sacrificial structure; depositing a second gate metal layer, by a sputtering process, on and in direct contact with the first metal layer and with the dielectric layer; and depositing a third gate metal layer on the second gate metal layer, the third gate metal layer including Aluminium. The second gate metal layer forms a barrier against diffusion of Aluminium atoms from the third metal layer towards the heterostructure.

In one or more embodiments, a HEMT device is provided that includes a heterostructure, a dielectric layer on the heterostructure, and a gate electrode extending completely through the dielectric layer. The gate electrode includes a first gate metal layer configured to form a Schottky contact with the heterostructure, a second gate metal layer on the first gate metal layer, and a third gate metal layer on the second gate metal layer. The third gate metal layer includes Aluminium, and the second gate metal layer forms a barrier against diffusion of Aluminium atoms from the third metal layer towards the heterostructure.

In one or more embodiments, a HEMT device is provided that includes a heterostructure, a dielectric layer on the heterostructure, and a gate electrode extending through the dielectric layer and contacting the heterostructure. The gate electrode includes a first gate metal layer overlying heterostructure, and a protection layer between the heterostructure and the first gate metal layer. The protection layer is configured to impede diffusion of metal atoms from the first metal layer towards the heterostructure.

BRIEF DESCRIPTION OF THE SEVERAL VIEWS OF THE DRAWINGS

For a better understanding of the present disclosure, preferred embodiments thereof are now described, purely by way of non-limiting example, with reference to the accompanying drawings, wherein.

DETAILED DESCRIPTION

Figure 1:
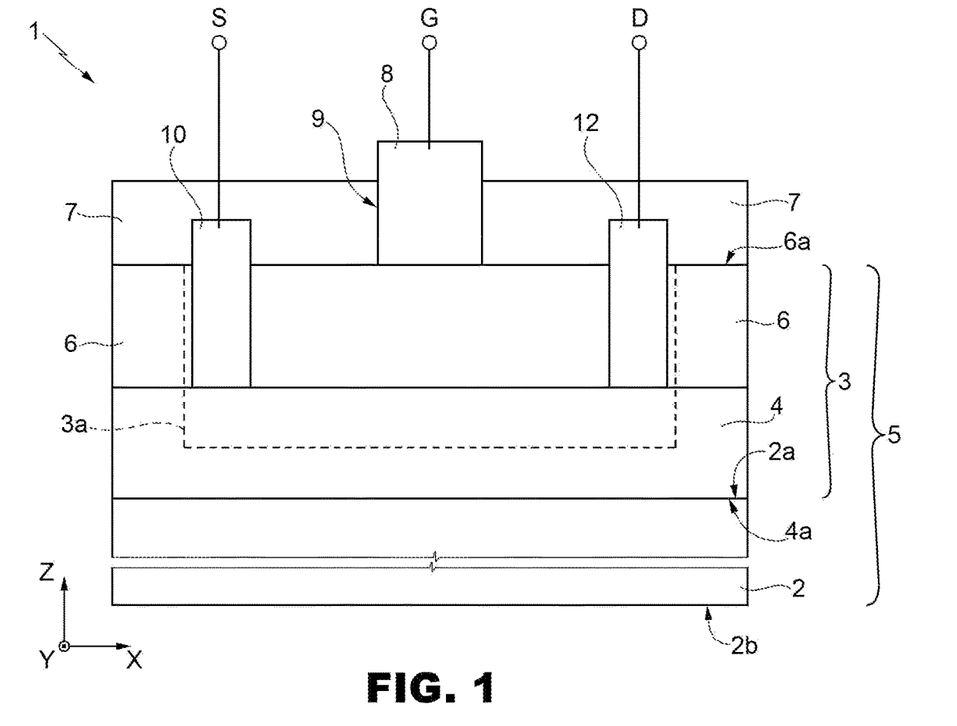
FIG. 1 shows, in a side cross-section view, a HEMT device according to an embodiment of the present disclosure.

FIG. 1 shows, in a tri-axial system of axes X, Y, Z orthogonal to each other, a HEMT device 1 of normally-on type, based on gallium nitride. The HEMT device 1 is particularly adapted to be used in RF applications, such as, for example, 4G and 5G base stations, including technology improvements and variants, portable telephones, RF cooking devices, drying and heating devices, devices and systems for avionics, L and S band radar, and the like.

The HEMT device 1 includes: a substrate 2, for example, of silicon, or silicon carbide (SiC) or sapphire ($Al_2O_3$); a channel layer 4, of intrinsic gallium nitride (GaN), extending over the substrate 2; a barrier layer 6, of intrinsic aluminium gallium nitride (AlGaN) or, more generally, of ternary, quaternary, gallium nitride alloy-based compounds, such as $Al_xGa_{1-x}N$, AlInGaN, $In_xGa_{1-x}N$, $Al_xIn_{1-x}Al$, extending over the channel layer 4; a passivation or insulating layer 7, of dielectric material such as silicon nitride ($Si_3N_4$) or silicon oxide ($SiO_2$), extending on an upper side 6a of the barrier layer 6; and a gate region (or gate electrode) 8 extending into the semiconductor body 5 between source and drain regions 10, 12.

The channel layer 4 and the barrier layer 6 form a heterostructure 3. The heterostructure 3 thus extends between a lower side 4a of the channel layer 4, which is part of the interface with the underlying substrate 2, and an upper side 6a of the barrier layer 6.

The substrate 2, the channel layer 4 and the barrier layer 6 are defined below, as a whole, with the term semiconductor body 5. The semiconductor body 5 houses an active region 3a, which houses, in use, the conductive channel of the HEMT device 1.

The gate region 8 is separated laterally (that is, along X) from the source and drain regions 10, 12 by respective portions of the insulating layer 7. The gate region 8 is of a recessed type, that is it extends deep through the insulation layer 7, up to reaching the upper side 6a of the barrier layer 6. In other words, the gate region 8 is formed in an opening 9 passing through the entire thickness, along Z, of the insulating layer 7; optionally, the opening 9 extends through a part of the barrier layer 6 (for example, for a depth of 1-10 nm). The gate region 8 extends at the active region 3a.

According to further embodiments (not shown), the semiconductor body 5, as well as the active region 3a housed therein, may comprise, according to the needs or design considerations, only one or more layers of GaN, or GaN alloy, suitably doped or of an intrinsic type.

The source and drain regions 10, 12, of conductive material, for example, metal, extend deep into the semiconductor body 5, completely through the barrier layer 6, terminating at the interface between the barrier layer 6 and the channel layer 4.

According to further embodiments, not illustrated, the source and drain regions 10, 12 further extend partially through the channel layer 4, and terminate in the channel layer 4.

According to yet further embodiments, not illustrated, the source and drain regions 10, 12 extend for a part of the thickness, along Z, of the barrier layer 6, terminating inside the barrier layer 6.

According to yet further embodiments, not illustrated, the source and drain regions 10, 12 extend exclusively through the insulating layer 7, up to reaching the surface 6a of the barrier layer 6, without sinking into the barrier layer 6.

Figure 2:
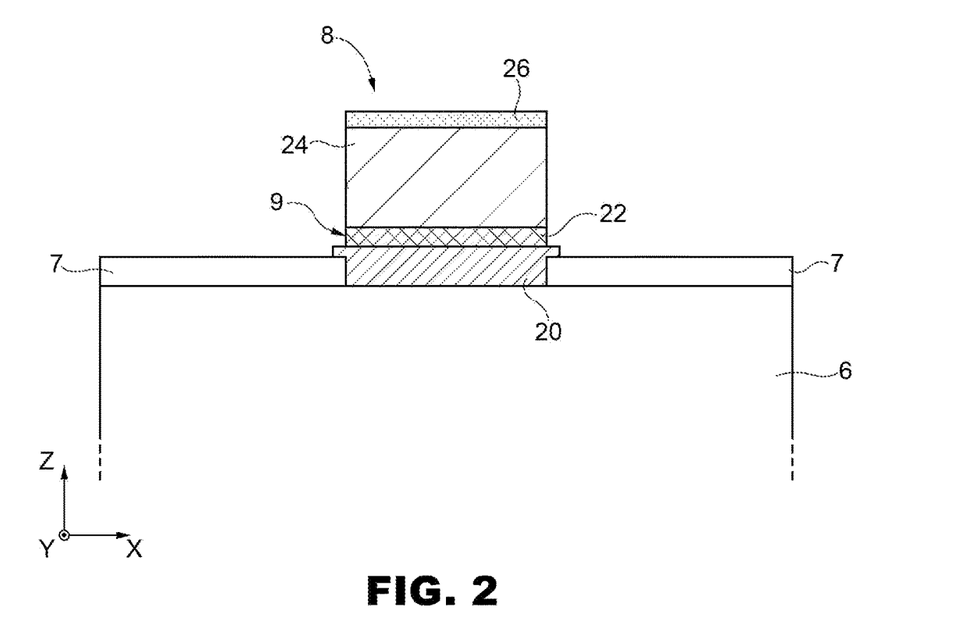
FIG. 2 shows, in a lateral cross-section view, an enlarged detail of the gate electrode of the HEMT device of FIG. 1.

According to an aspect of the present disclosure, as illustrated in FIG. 2 which represents an enlarged detail of the gate region 8 of FIG. 1, the gate region 8 is formed by a stack, including: a first metal layer 20 adapted to favor the formation of a Schottky contact with the heterostructure 3 (here, in particular, with the barrier layer 6); a protection layer (or diffusion barrier) 22 adapted to prevent the diffusion of metal atoms towards the heterostructure 3, extending completely above the first metal layer 20; a second metal layer 24 adapted to form a gate contact with reduced resistivity, extending over the protection layer 22 and isolated from the semiconductor body 5 by the protection layer 22; and a cap layer 26 adapted to protect the second metal layer 24 from external agents (e.g., protection from corrosion, oxidation, etc.).

In case the protection layer 22 is adapted to favor the formation of a Schottky contact with the heterostructure 3, the first metal layer may be omitted.

Furthermore, in case the second metal layer 24 is a material not subject to degradation phenomena, or in case degradation phenomena are negligible, the cap layer 26 may be omitted.

More in detail, in an embodiment of the present disclosure, the first metal layer 20 is a Nickel (Ni) layer in contact with the barrier layer 6; the protection layer 22 is a Tungsten Nitride (WN) layer extending over the Ni layer 20; the second metal layer 24 is an Aluminium (Al) layer extending above the WN layer 22; and the cap layer 26 is a Titanium Nitride (TiN) layer extending above the Al layer 24.

The Ni layer 20, which has the function of favoring the creation of a Schottky contact with the underlying barrier layer 6, may be replaced by, for example, a Pt, or Pd layer (in general, hard to be etched materials). The Ni layer 20 has a thickness exemplarily chosen between 30 nm and 200 nm. The Ni layer 20 may be omitted in case of using Tungsten Nitride for the protection layer 22, since the latter is adapted to form a good Schottky contact with the AlGaN of the barrier layer 6. In this case, the WN layer 22 is in direct contact with the barrier layer 6.

The WN layer 22, in case the Ni layer 20 is present, may be replaced by a different metal nitride layer, such as, for example, Tantalum Nitride (TaN), or Titanium-Titanium Titanium-Oxynitride (TiTiONTi), with barrier properties for the diffusion of metal atoms coming from the overlying metal layer 24. The WN layer 22 has a thickness exemplarily chosen between 20 nm and 100 nm.

The Al layer 24 has the function of improving the electrical conductivity of the gate region 8, obviating the problems of reduced electrical conductivity of the Ni layer 20. The Al layer 24 is completely separated or isolated from the heterostructure 3 by the WN layer 22. The WN layer 22, therefore, forms a barrier against the diffusion of the Aluminium from the Al layer 24 towards the heterostructure 3. The Al layer 24 has a thickness exemplarily chosen between 400 nm and 800 nm. The Al layer 24 may be exemplarily replaced by another metal layer compatible with CMOS processes.

The TiN layer 26 has the function of further protective layer, adapted to prevent Aluminium degradation phenomena, such as corrosion, oxidation, and the like. The TiN layer 26 has a thickness exemplarily chosen between 10 nm and 50 nm. The TiN layer 26 may be exemplarily replaced by a material having similar properties and/or functionalities. Alternatively, the TiN layer 26 may be omitted, in particular if an organic material is used under the resist as anti-reflective (however, this anti-reflective material may be omitted for large geometries for which the lithography is not affected by the reflectivity of the substrate).

Manufacturing steps of the gate region 8 of the HEMT device 1 of FIG. 1 are described below with reference to FIGS. 3A-3F. FIGS. 3A-3F are limited to the manufacturing of the gate region 8 and do not illustrate (contextual, preceding and/or subsequent) steps for the formation of the source and drain terminals, electrical contact metallizations, generic electrical connections, and any other, per se known, element, useful or necessary for the operation of the HEMT device 1.

Figure 3A:
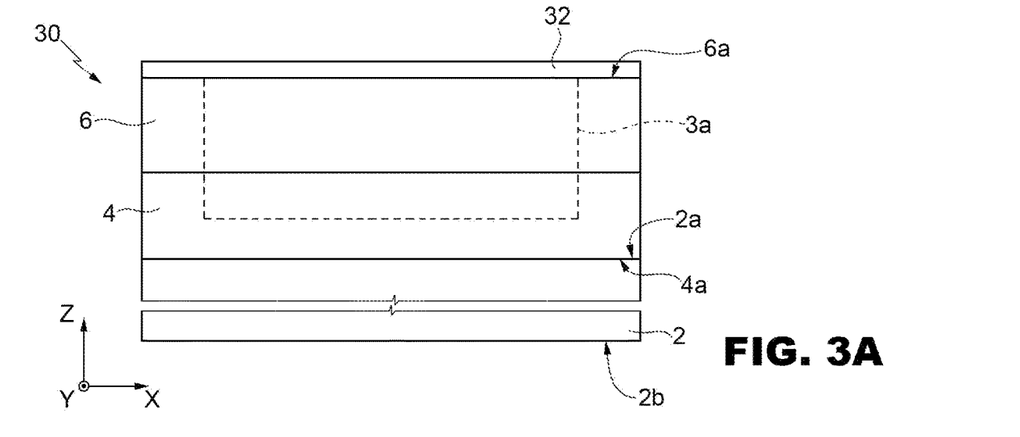
FIGS. 3A-3H illustrate manufacturing steps of the HEMT device of FIG. 1.

FIG. 3A shows, in a lateral cross-section view in the same reference system of FIG. 1, a portion of a wafer 30 during a manufacturing step of a HEMT device, according to an embodiment of the present disclosure. Elements of the wafer 30 common to what already described with reference to FIG. 1, and shown in this FIG. 1, are indicated with the same reference numbers and are not further described in detail.

In particular, again with reference to FIG. 3A, the wafer 30 is arranged comprising: the substrate 2, for example, of silicon (Si) or silicon carbide (SiC) or aluminium oxide ($Al_2O_3$), having a front side 2a and a back side 2b opposite to each other in a direction Z; the channel layer 4, of gallium nitride (GaN), having its lower side 4a which extends adjacent to and overlapping the front side 2a of the substrate 2; and the barrier layer 6, of aluminium gallium nitride (AlGaN), extending over the channel layer 4. The barrier layer 6 and the channel layer 4 form, as said, a heterostructure 3.

On the front side of the barrier layer 6 a passivation layer, or dielectric layer, 32 of dielectric or insulating material such as silicon nitride (SiN), silicon oxide ($SiO_2$), or yet other material, is formed. The insulating layer 32 has a thickness between 5 nm and 300 nm, for example, equal to 100 nm, and is formed by means of deposition CVD or atomic layer deposition ALD and, at the end of the manufacturing steps, it will form the insulating layer 7 of FIG. 1.

Figure 3B:
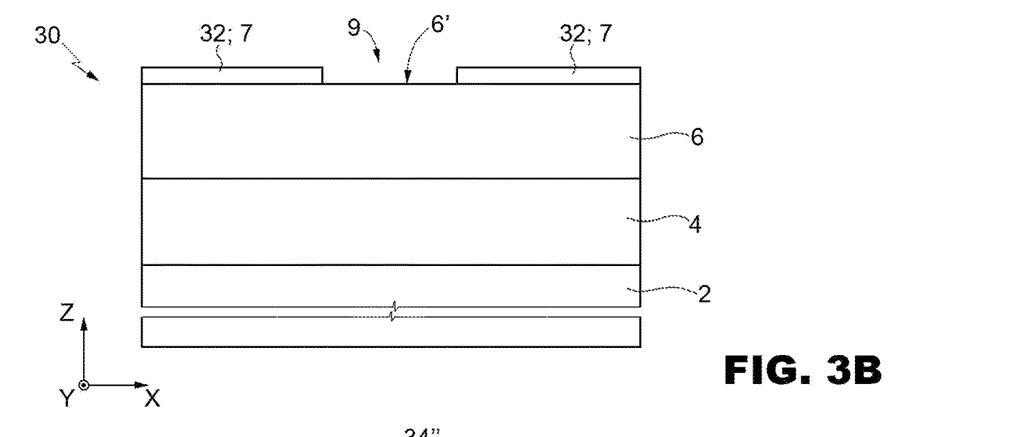

Then, FIG. 3B, the insulating layer 32 is selectively removed, for example, by means of lithography and etching steps, so as to remove selective portions of the same at the region of the wafer 30 in which, in subsequent steps, it is desired to form a gate region of the HEMT device (that is, at a part of the active area 3a).

The etching step may stop at the underlying barrier layer 6, or continue partially inside the barrier layer 6, according to respective embodiments. In both cases, a superficial portion 6' of the underlying barrier layer 6 is exposed. The etching of the barrier layer 6 is, for example, carried out by means of dry etching. The portion of the barrier layer 6 removed generates a cavity having a depth between, for example, 0-5 nm along Z.

Thus, the opening 9 extending over the entire thickness of the insulating layer 32 is formed. The insulating layer 32 thus patterned corresponds to the insulating layer 7 of FIG. 1.

Figure 3C:
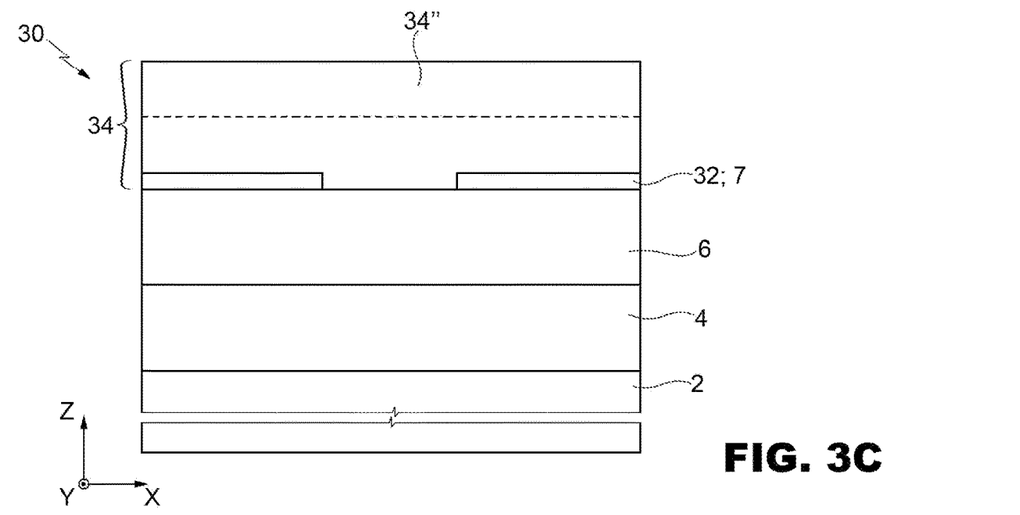

Then, FIG. 3C, a stack 34 of sacrificial layers is formed on the wafer 30. In particular, there are formed:

a first sacrificial layer 34', of a non-photosensitive (or non-photodefinable) organic polymer solution, in particular commercially known as "PMGI," or "SF11" (it is a resist including a poly-dimethyl-glutarimide polymer), with a thickness between 0.6 µm and 1.3 µm (according to the subsequent metal thickness that is to be evaporated); and a second sacrificial layer 34", of photosensitive or photodefinable material (e.g., photoresist), which extends over the first sacrificial layer 34', with a thickness between 0.6 µm and 4 µm.

Both the first and the second sacrificial layers 34', 34" may be formed by means of spin-coating technique.

The stack 34 extends on the insulating layer 7 and inside the opening 9.

Figure 3D:
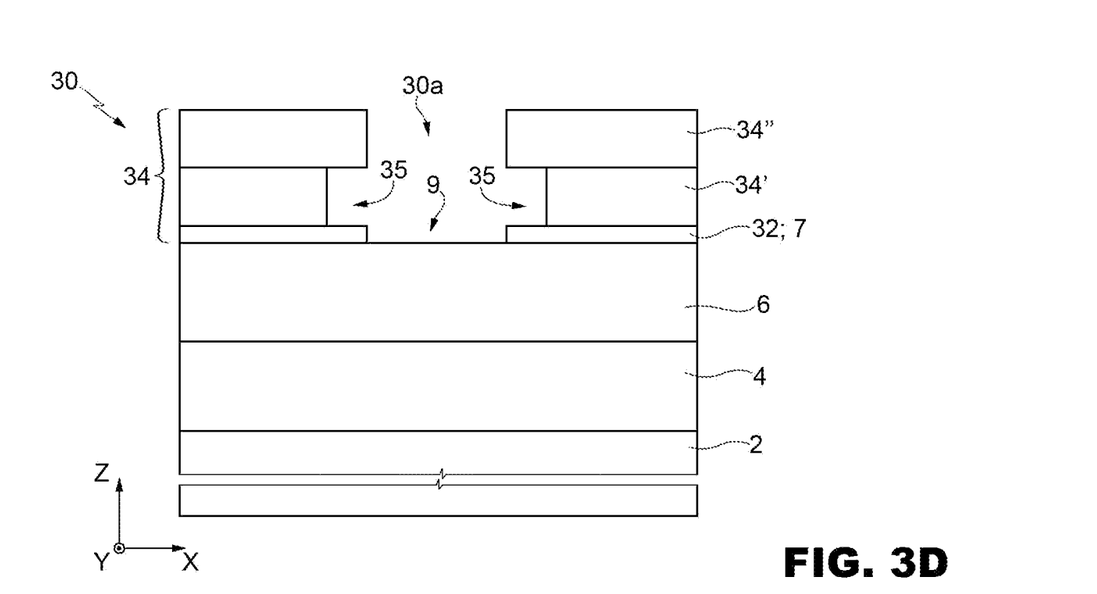

Subsequently, FIG. 3D, the second sacrificial layer 34" is patterned, by means of a lithography and development step, to remove selective portions of the sacrificial layer 34" at the opening 9, that is at the region of the wafer 30 wherein it is desired to form the gate 8. Since the first sacrificial layer 34' is not photosensitive, the lithography step of the second sacrificial layer 34" has no effect on the first sacrificial layer 34'. At the end of the development of the second sacrificial layer 34" (e.g., by means of TMAH), the first sacrificial layer 34' is partially exposed at the regions of the second sacrificial layer 34" removed. During this step the isotropic etching of the first sacrificial layer 34' also occurs, to uniformly remove the regions of the first sacrificial layer 34' exposed. Since the etching is of isotropic type, a removal of the first sacrificial layer 34' is observed also below the second sacrificial layer 34" (that is, an "underetch" or "undercut" phenomenon), which extends towards the source and drain regions, without reaching them. In the section view of FIG. 3D, undercut regions 35 extend along the direction X.

The removal of the first sacrificial layer 34' continues up to reaching the barrier layer 6.

Following this step, the stack 34 remains on the wafer 30, covering it, except for a region 30a in which it is desired to form the gate region 8.

Figure 3E:
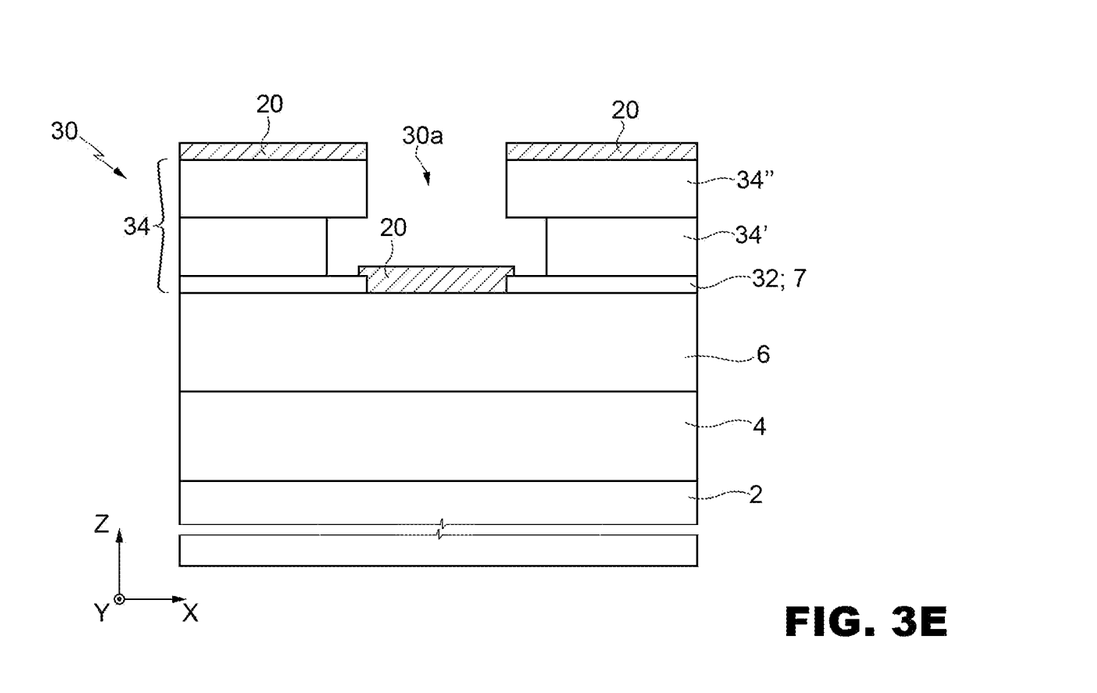

Then, FIG. 3E, a step for forming the first metal layer 20 of the gate region 8 is carried out.

To this end, the following process steps are carried out.

After having introduced the wafer 30 into a deposition chamber by means of evaporation of any suitable type, a deposition by evaporation process, for example, using an "electron gun" as a type of source, of a Nickel target is carried out. The evaporation process is carried out for a time necessary or suitable to deposit a layer of nickel at the desired thickness. By way of example, the pressure in the evaporation chamber is kept at a value of about $10^{-6}$ mbar, and the deposition rate between about 0.1 nm/s and 1 nm/s. The first metal layer 20 is thus formed.

The first metal layer 20 extends partially into the opening 9, in contact with the barrier layer 6, and above the second sacrificial layer 34". The Applicant has found that the type of deposition method chosen (evaporation) for the first metal layer 20, together with the conformation of the stack 34 of sacrificial layers, allows to avoid the deposit of the first metal layer 20 along the vertical walls (that is extending along Z) of the first sacrificial layer 34'. In other words, the metal layer 20 has an extension, in plan view, substantially determined by the opening through the second sacrificial layer 34". It is apparent that, during the deposition, even if the metal layer 20 has a determined extension of the first sacrificial layer 34', portions of Nickel typically extend also outside this opening 9. In fact, considering the current technologies and processes, it is common that the evaporated metal material also deposits laterally at the opening 9 over the insulating layer, mainly due to the fact that, generally, there is an opening 34" slightly larger than the opening 9 (to avoid that, due to a possible misalignment of the masks, the metal does not entirely cover the region 9 and also to form a field plate).

Figure 3F:
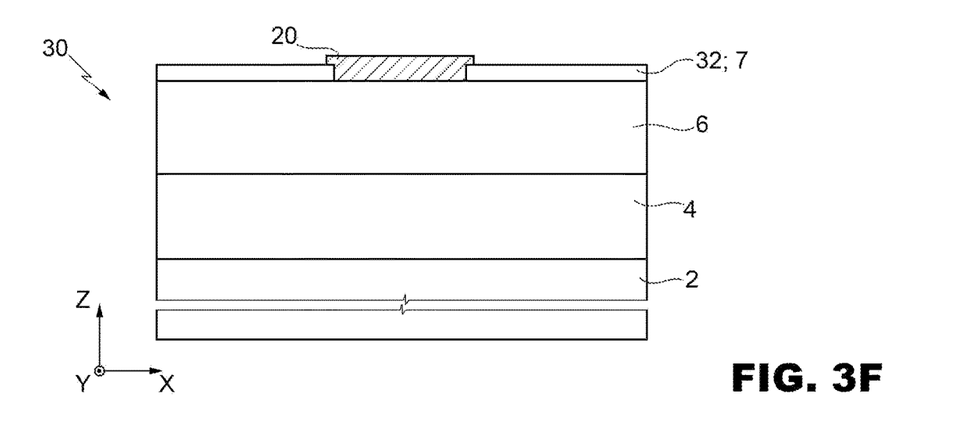

Then, FIG. 3F, by means of lift-off process, of any suitable type, the first and the second sacrificial layers 34', 34" are removed, and with them also the portions of the first metal layer 20 extending above the second sacrificial layer 34", that is, outside the region 30a of the wafer 30 in which it is desired to form the gate region 8.

The presence of the undercut regions 35 is advantageous during this lift-off step, since the absence of a layer of Nickel along the vertical walls of the first sacrificial layer 34' does not compromise the lift-off.

Figure 3G:
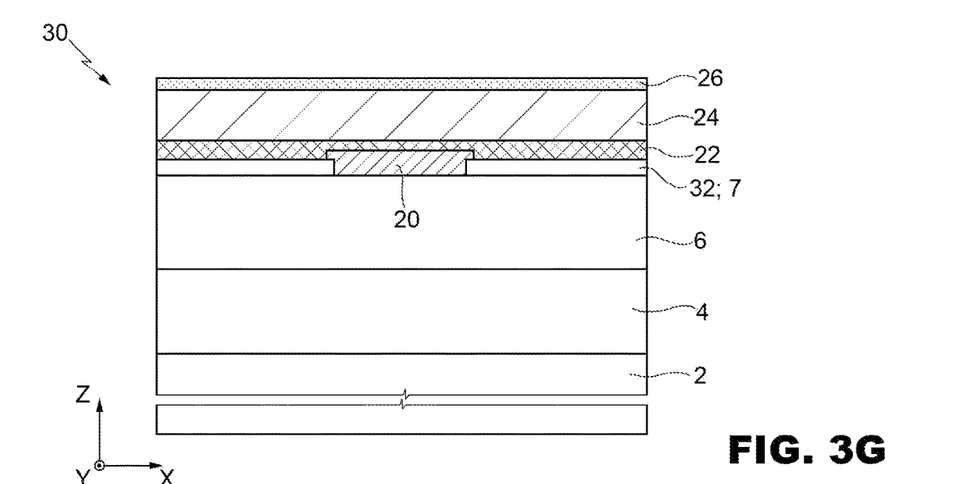

Next, FIG. 3G, the step of forming the protection layer 22, of WN, is carried out. To this end, a sputtering process is carried out, in any suitable manner.

The Applicant has found that a WN layer deposited by sputtering meets the barrier requirements or otherwise is suitable for use against the diffusion of atoms coming from the metal layer 24 of Aluminium.

Then, the formation of the Al layer 24 and the TiN layer 26 is carried out, by any suitable means or methods, for example, by means of sputtering.

Figure 3H:
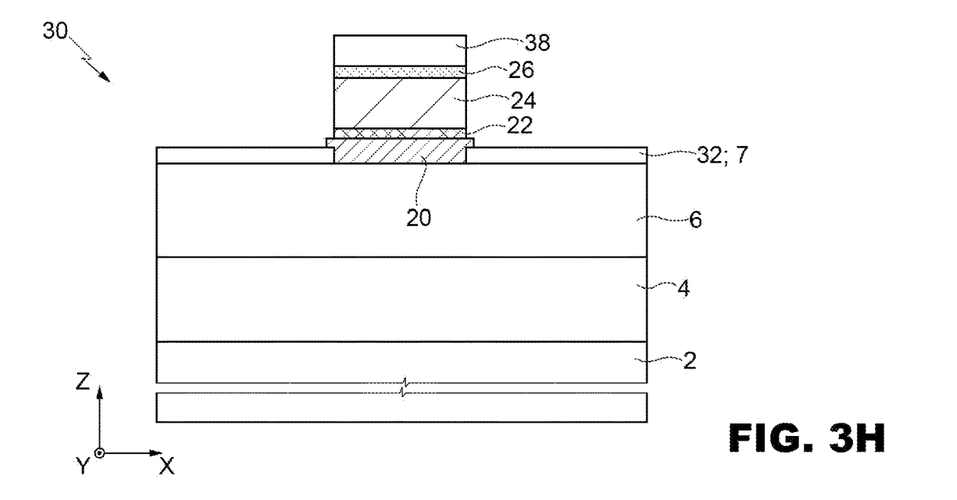

With reference to FIG. 3H, by means of masked etching steps, using a mask 38, for example, of photoresist, the portions of the WN and Al metal layers so formed are removed, which extend outside the region in which it is desired to form the gate 8. The etching is carried out, to remove the Al layer 24 and the WN layer 22, using a dry process with a Chlorine ($Cl_2$) Boron trichloride ($BCl_3$) and Argon (Ar)-based chemistry, normally used for metal etchings.

It is noted that, given the high selectivity of the etching used to remove Aluminium and Tungsten Nitride with respect to the Nickel, the first metal layer 20 is not damaged or over-etched by the etching of FIG. 3H. It is apparent that this advantage is also achieved in case other materials are used, other than Nickel, but having the same selectivity characteristics as the etching, for example, Pt or Pd.

The mask 38 is then removed and the device 1 of FIG. 2 is thus formed, provided with the gate region 8 illustrated in detail in FIG. 2.

The advantages of the disclosure according to the present disclosure are clear from the above description.

In particular, a method for manufacturing a GaN-based HEMT device is proposed for RF applications, compatible with CMOS production lines and without the disadvantages related to the gate leakage current observable in devices of a known type.

Finally, it is clear that modifications and variations may be made to what is described and illustrated herein without thereby departing from the scope of protection of the present disclosure, as defined in the attached claims.

For example, there may be a stack of overlapping layers extending between the substrate 2 and the heterostructure 3, for example, including a buffer layer and a hole supplying layer.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high electron mobility transistor (HEMT) device, comprising:
a heterostructure that includes:
a gallium nitride layer;
an aluminum gallium nitride layer on the gallium nitride layer;
a dielectric layer on the aluminum gallium nitride layer; and
a gate electrode extending completely through the dielectric layer, the gate electrode layer being in contact with the aluminum gallium nitride layer, the gate electrode including:
a first gate metal layer in contact with the aluminum gallium nitride layer, the first gate metal layer having a first surface and a first dimension along the first surface, the first gate metal layer being configured to form a Schottky contact with the heterostructure;
a second gate metal layer on the first gate metal layer and contacting the first gate metal layer at the first surface, the second gate metal layer having a second surface opposite to the first surface, the second gate metal layer having a second dimension along the second surface;
a third gate metal layer on the second gate metal layer, the third gate metal layer including aluminum, the third gate metal layer contacting the second gate metal layer at the second surface, the third gate metal layer having a third surface opposite to the second surface, the third gate metal layer having a third dimension along the third surface, wherein the second dimension and the third dimension is less than the first dimension; and
a source or a drain region that includes a first end in the dielectric layer and a second end that extends completely through the aluminum gallium nitride layer, the second end in contact with the gallium nitride layer.

2. The HEMT device according to claim 1, wherein the dielectric layer includes silicon nitride.

3. The HEMT device according to claim 1, wherein the first gate metal layer includes Nickel, and the second gate metal layer includes tungsten nitride.

4. The HEMT device according to claim 1, wherein the gate electrode further includes a cap layer on the third gate metal layer and configured to protect the third gate metal layer from environmental agents.

5. The HEMT device according to claim 4, wherein the cap layer includes titanium nitride.

6. The HEMT device according to claim 1, wherein the gallium nitride layer is a channel layer and the aluminum gallium nitride layer is a barrier layer.

7. The HEMT device according to claim 1, wherein:
the source region, extending into the heterostructure and terminating in the heterostructure; and
the drain region extending into the heterostructure at a distance from the source region, the drain region terminating in the heterostructure; and
the gate electrode being in direct electrical contact with the heterostructure.

8. A device, comprising:
a heterostructure that includes:
a first layer;
a second layer on the first layer;
a dielectric layer on the second layer; and
a gate electrode extending through the dielectric layer and contacting a top surface of the second layer, the gate electrode including:

a first gate layer of nickel overlying the heterostructure, the first gate layer is in direct contact with the dielectric layer and in direct contact with the top surface of the second layer;

a second gate layer of tungsten nitride on the first gate layer, the second gate layer is separated from the dielectric layer by the first gate layer; and a third gate layer of aluminum on the tungsten nitride layer, the third gate layer having a top surface and a bottom surface, the bottom surface facing the second gate layer, the top surface having a top dimension equal to a bottom dimension of the bottom surface;

an electrode extending into the heterostructure, the electrode includes a first end that terminates in the dielectric layer and a second end that terminates on a top surface the first layer, the second end opposite to the first end, and the gate electrode contacts the top surface of the second layer at a position between the first end and the second end.

9. The device according to claim 8, wherein the first gate metal layer is configured to form a Schottky contact with the heterostructure.

10. The device according to claim 8, wherein the third gate metal layer is in direct contact with the second gate metal layer, the third gate metal layer being separated from the dielectric layer.

11. The device according to claim 10, wherein the third layer includes aluminum.

12. A device, comprising:
a barrier layer;
a first insulting layer on the barrier layer;
an opening in the first insulating layer that exposes the barrier layer, the opening having a first side that is separate from a second side in a first direction;
a first conductive layer in the opening, in contact with the first and second sides of the opening, and on and in contact with portions of the first insulating layer, the first conductive layer having a first dimension in the first direction on the portions of the first insulating layer and a second dimension in the first direction from the first side to the second side of the opening, the second dimension being less than the first dimension, the first conductive layer having a planar first surface on portions of the first insulating layer;
a second conductive layer on the first conductive layer, the second conductive layer having a planar second surface facing the first conductive layer and a planar third surface opposite to the second surface, the second conductive layer having a third dimension in the first direction on the third surface and on the second surface, the third dimension being less than the first dimension, the first conductive layer having a fourth dimension in a second direction that is transverse to the first direction, the second conductive layer having a fifth dimension in the second direction, the fifth dimension being greater than the fourth dimension; and
a protection layer between the first and second conductive layers in the second direction, the protection layer having the second dimension in the first direction.

13. The device of claim 12 wherein the first conductive layer has vertical sidewalls.

14. A device, comprising:
a barrier layer;
a first insulting layer on the barrier layer;
an opening in the first insulating layer that exposes the barrier layer, the opening having a first side that is separate from a second side in a first direction;
a first conductive layer in the opening, in contact with the first and second sides of the opening, and on and in contact with portions of the first insulating layer, the first conductive layer having a first dimension in the first direction on the portions of the first insulating layer and a second dimension in the first direction from the first side to the second side of the opening, the second dimension being less than the first dimension, the first conductive layer having a planar first surface on portions of the first insulating layer;
a second conductive layer on the first conductive layer, the second conductive layer having a planar second surface facing the first conductive layer and a planar third surface opposite to the second surface, the second conductive layer having a third dimension in the first direction on the third surface and on the second surface, the third dimension being less than the first dimension, the first conductive layer having a fourth dimension in a second direction that is transverse to the first direction, the second conductive layer having a fifth dimension in the second direction, the fifth dimension being greater than the fourth dimension; and
a heterostructure that includes the barrier layer, the first conductive layer configured to form a Schottky contact with the heterostructure.

15. The device of claim 14, comprising a protection layer between the first and the second conductive layers, the second conductive layer including aluminum, wherein the protective layer forms a barrier against diffusion of aluminum atoms from the second conductive layer towards the heterostructure.

16. The device of claim 15, wherein the first insulating layer includes silicon nitride, the first conductive layer includes Nickel, and the protective layer includes tungsten nitride.

17. The device of claim 16, comprising a cap layer on second conductive layer.

18. The device of claim 17, wherein the cap layer includes titanium nitride.

* * * * *